United States Patent
Lin et al.

(10) Patent No.: US 8,964,394 B2
(45) Date of Patent: Feb. 24, 2015

(54) HEATING AND HEAT DISSIPATING MULTI-LAYER CIRCUIT BOARD STRUCTURE FOR KEEPING OPERATING TEMPERATURE OF ELECTRONIC COMPONENTS

(75) Inventors: Tzu Cheng Lin, New Taipei (TW); Wei Cheng Chou, New Taipei (TW)

(73) Assignee: Moxa Inc., New Taipei (TW)

( * ) Notice: Subject to any disclaimer, the term of this patent is extended or adjusted under 35 U.S.C. 154(b) by 367 days.

(21) Appl. No.: 13/545,971

(22) Filed: Jul. 10, 2012

(65) Prior Publication Data

US 2014/0016261 A1     Jan. 16, 2014

(51) Int. Cl.
    *H05K 7/20*      (2006.01)
    *H05K 1/02*      (2006.01)

(52) U.S. Cl.
    CPC .................................. *H05K 1/0209* (2013.01)
    USPC ........................................................ 361/720

(58) Field of Classification Search
    CPC ..... H05K 1/0209; H01L 21/00; H01L 23/495
    See application file for complete search history.

(56) References Cited

U.S. PATENT DOCUMENTS

| | | | |
|---|---|---|---|
| 4,279,292 A * | 7/1981 | Swiatosz ......................... | 165/61 |
| 4,374,316 A * | 2/1983 | Inamori et al. ................ | 219/209 |
| 6,054,676 A * | 4/2000 | Wall et al. ...................... | 219/209 |
| 6,246,581 B1 * | 6/2001 | Kang et al. ..................... | 361/700 |
| 6,292,365 B1 * | 9/2001 | Ashiwake et al. ............. | 361/700 |
| 7,278,199 B2 * | 10/2007 | Tateyama et al. ............ | 29/592.1 |
| 2013/0148250 A1 * | 6/2013 | Day et al. ....................... | 361/149 |

* cited by examiner

*Primary Examiner* — Gregory Thompson
(74) *Attorney, Agent, or Firm* — Chih Feng Yeh; Huntington IP Consulting Co., Ltd.

(57) ABSTRACT

A heating and heat dissipating multi-layer circuit board structure for keeping operating temperatures of electronic components is provided. The outer layer of the multi-layer printed circuit board is in contact with electronic components. The operating temperatures of electronic components are measured through by a temperature measuring circuit. When the operating temperature of at least one electronic component is lower than a default temperature, the heating circuits corresponding to the electronic components are enabled respectively to heat the electronic components through corresponding heat conduction elements. When the operating temperature of at least one electronic component is higher than another default temperature, the heating circuits corresponding to the electronic components are disabled to transfer the heat from the electronic components to the heat conduction elements automatically. Therefore, the structure achieves the goal of keeping the operating temperature of each electronic component in the corresponding environment.

7 Claims, 12 Drawing Sheets

HEATING AND HEAT DISSIPATING MULTI-LAYER CIRCUIT BOARD STRUCTURE FOR KEEPING OPERATING TEMPERATURE OF ELECTRONIC COMPONENTS

BACKGROUND OF THE RELATED ART

1. Technical Field

The invention relates to a multi-layer circuit board structure and, in particular, to a heating and heat dissipating multi-layer circuit board structure for maintaining the operating temperature of electronic components thereon.

2. Related Art

The industrial computer has a very broad range of applications. In other words, the industrial computer needs to have applications in different industrial environments. There is a difference in the electronic components of the industrial computer by their high and low power consumption. When an industrial computer is to be used in a high temperature environment, usual heat dissipating is sufficient for the operating temperature ranges of low-power electronic components because they generate less heat. For higher-power electronic components, they generate more heat and thus need a special heat dissipating design in order to satisfy the operating temperature ranges of high-power electronic components.

When industrial computers are used in a low-temperature environment, as high-power electronic components generate more heat, they can generate sufficient heat to meet the requirement of the operating temperature range thereof. Electronic components, however, generate less heat. Thus, in a low-temperature environment, the low-power electronic components under normal use may go beyond its critical operating temperature. Such low-power electronic components working beyond its temperature specifications may malfunction, and even cause severe industrial computer crashes.

In summary, the prior art always has the problem that electronic components used in high and low temperature environments may exceed their critical temperatures. It is necessary to improve the technology to solve this problem.

SUMMARY

In view of the foregoing, the invention provides a heating and heat dissipating multi-layer circuit board structure for keeping the operating temperatures of electronic components thereof.

The heating and heat dissipating multi-layer circuit board structure for keeping the operating temperatures of electronic components includes: at least one electronic component and a multi-layer printed circuit board (PCB), wherein the electronic components are in touch with the outer surface of the multi-layer printed circuit board, at least two layers adjacent to the electronic components are provided with at least one heating circuit and at least one thermal conduction element at the place corresponding to each of the electronic components.

The multi-layer PCB further includes: a temperature sensing circuit and a control circuit. The temperature sensing circuit is electrically connected with the heating circuit configured on the outer layer of the PCB or with the thermal conduction element. The temperature of one of the heating circuits or thermal conduction elements is detected to represent the operating temperature of the corresponding electronic component. The control circuit electrically connects to the heating circuits. When the operating temperature of the electronic component detected by the sensing circuit sensing is lower than a first preset value for the electronic component, the control circuit enables the heating circuit corresponding to the contact position of the electronic component. Through the condition of the thermal conduction element, the electronic component is then heated. The first preset value is set according to the corresponding one electronic component. When the operating temperature of the electronic component detected by the sensing circuit sensing is lower than a second preset value for the electronic component, the control circuit disables the heating circuit corresponding to the contact position of the electronic component. Through the condition of the thermal conduction element, the electronic component is then cooled. The second preset value is set according to the electronic component.

The disclosed system and method are described above. They differ from the prior art in that the electronic components are in contact with the outer surface of the multi-layer PCB. At least two layers adjacent to the electronic components are configured with heating circuits and thermal conduction elements at positions corresponding to the contact positions of the electronic components. The temperature sensing circuit in the multi-layer PCB detects the operating temperatures of the electronic components. When the temperature sensing circuit detects that the operating temperature of the electronic component is lower than the first preset value, the control circuit thereon enables the heating circuit corresponding to the electronic component. Through the conduction of the thermal conduction element, the corresponding electronic component is heated. When the operating temperature of the electronic components is higher than the second preset value, the control circuit disables the heating circuit corresponding to the electronic component. The thermal conduction element then cools the corresponding electronic component. This can prevent the electronic component from exceeding its range of operating temperature, thereby increasing the stability and lifetime of the electronic components.

Through the above techniques, the invention can maintain the operating temperatures of the electronic components in different temperature environments.

BRIEF DESCRIPTION OF THE DRAWINGS

The invention will become more fully understood from the detailed description given herein below illustration only, and thus is not limitative of the present invention, and wherein.

DETAILED DESCRIPTION

The present invention will be apparent from the following detailed description, which proceeds with reference to the accompanying drawings, wherein the same references relate to the same elements.

Figure 1:
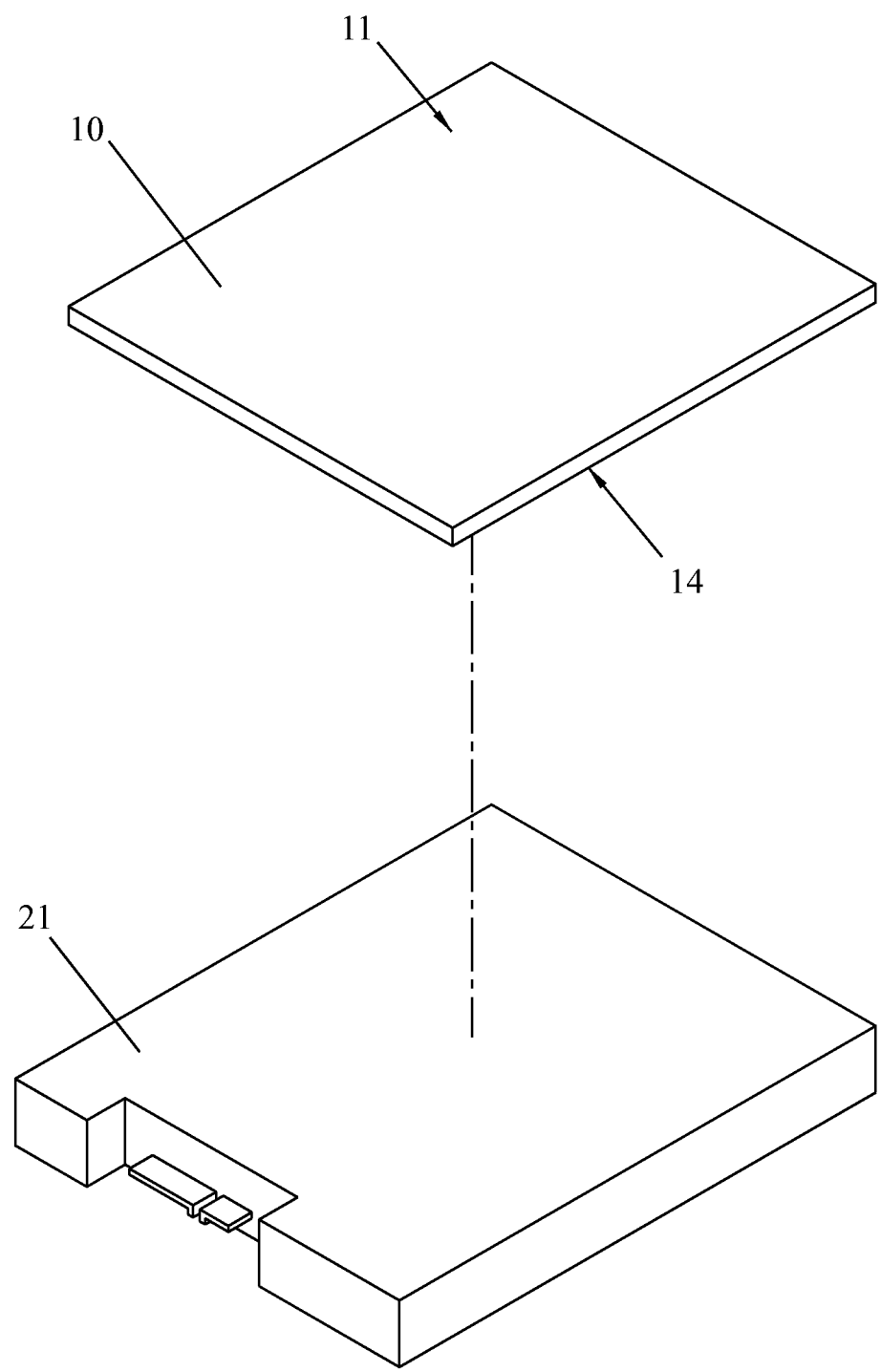
FIG. 1 is a three-dimensional view of the first embodiment.
Figure 2:
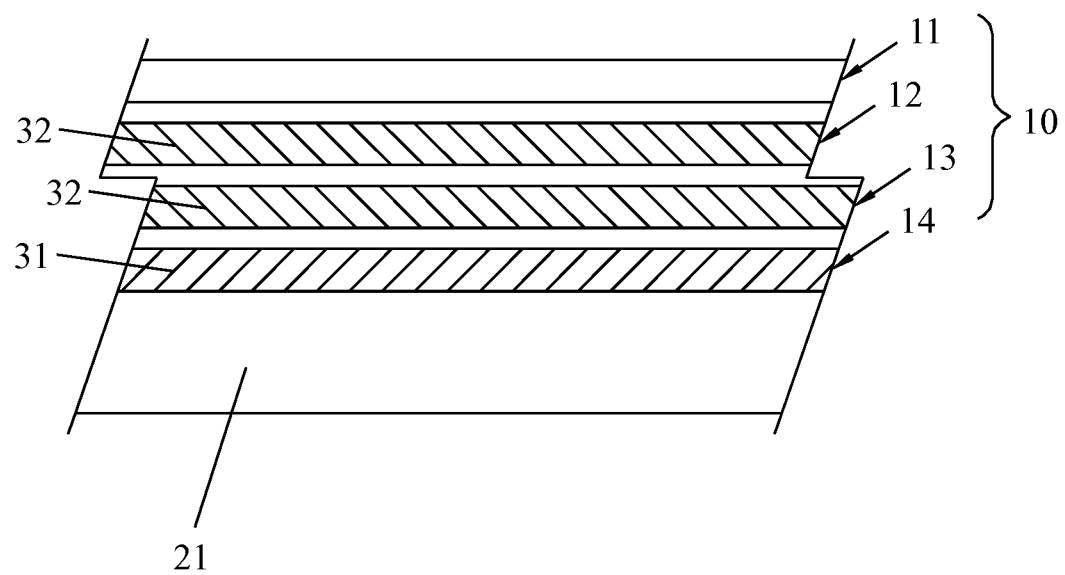
FIG. 2 is a side view of the multi-layer PCB in the first embodiment.

First, please refer to FIGS. 1 and 2. FIG. 1 is a three-dimensional view of the first embodiment of the invention. FIG. 2 is a side view of the multi-layer PCB in the first embodiment.

In the first embodiment of the invention, the electronic component 21 is represented by a hard disk drive (HDD). The multi-layer PCB 10 is a four-layered PCB containing a first layer 11, a second layer 12, a third layer 13, and a fourth layer 14. The first layer 11 and the fourth layer 14 are the outer layers of the multi-layer PCB 10. The second layer 12 and the third layer 13 are the inner layers of the multi-layer PCB 10.

The electronic component 21 is in contact with the surface of the fourth layer 14 of the multi-layer PCB 10 by attaching in conjunction with other fixation methods (e.g., screwing). The power of the multi-layer PCB 10 and the electronic component 21 is provided by an external power source (not shown). For example, a motherboard provides the power of the multi-layer PCB 10 and the electronic component 21. Such a possibility is only an example, and should not be used to restrict the scope of the invention.

Figure 3:
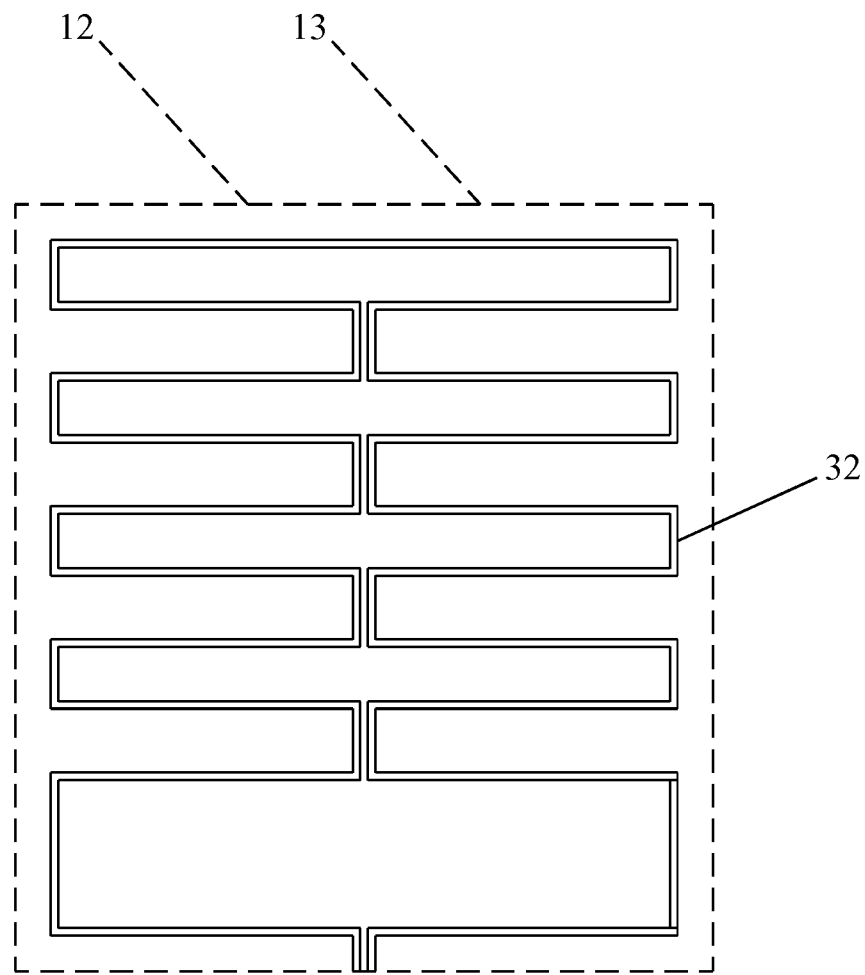
FIG. 3 is a planar view of the fourth layer of the multi-layer PCB in the first embodiment.

Please simultaneously refer to FIGS. 2 and 3. FIG. 3 is a planar view of the fourth layer of the multi-layer PCB according to the first embodiment.

The electronic component 21 has a surface contact with the fourth layer 14 of the multi-layer PCB 10. In the first embodiment, a heat conduction element 31 is provided at the position corresponding to the contact position of the electronic component 21 on the fourth layer 14. Since the electronic component 21 is an HDD here, the heat conduction element 31 covers the entire fourth layer 14.

The heat conduction element 31 is made of the combination of metal, semiconductor and polymer with high thermal conductivities. For example, the heat conduction element 31 is a thick copper plate or an aluminum plate. These are only examples in the first embodiment, and should not be used to restrict the scope of the invention.

Figure 4:
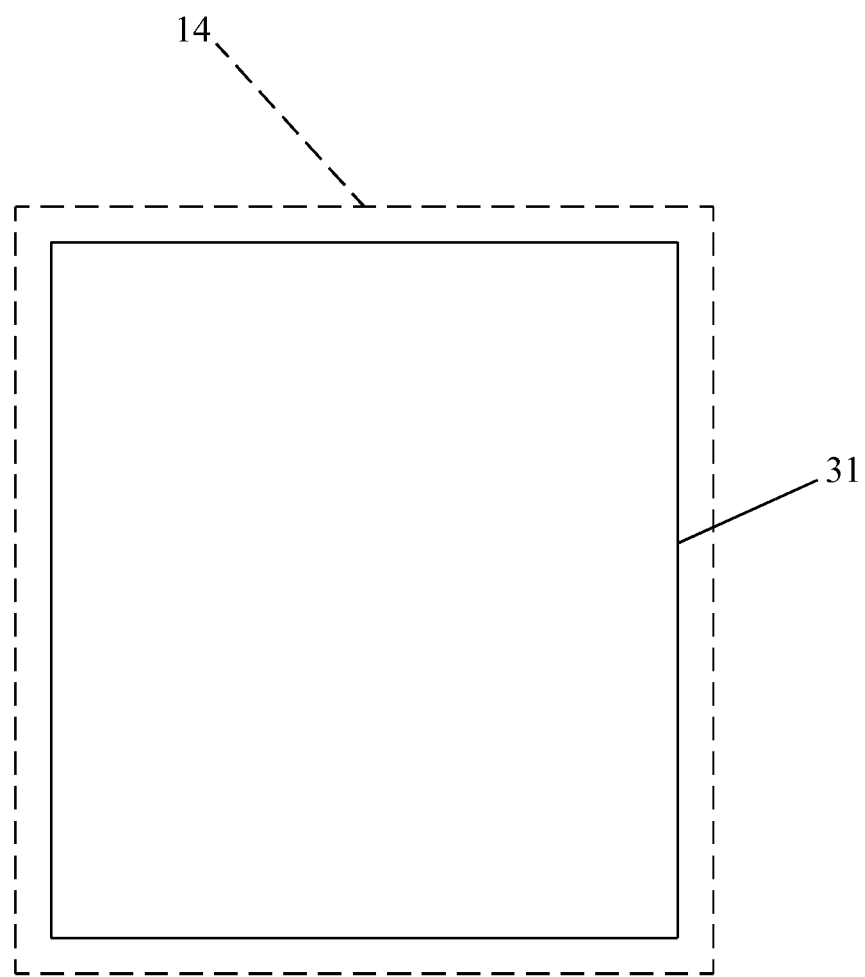
FIG. 4 is a planar view of the third and second layers of the multi-layer PCB in the first embodiment.

Please refer simultaneously to FIGS. 2 and 4. FIG. 4 is a planar view of the configurations of the third and second layers in the multi-layer PCB of the first embodiment.

The electronic component 21 is in surface contact with the fourth layer 14 of the multi-layer printed circuit board 10. Therefore, in the first embodiment, the heating circuit 32 is provided at the position of the electronic components 21 between the third layer 13 and the second layer 12. Since the electronic component 21 is an HDD, the heating circuit 32 covers entirely the third layer 13 and the second layer 12.

Please refer again to FIGS. 1 and 2. The first layer 11 of the multi-layer PCB 10 is the substrate of the PCB, such as FR-1, FR-2, FR-3, FR-4, G-10, CEM-1, CEM-2 AIN, SIC, etc. The surface of the first layer 11 is provided with a temperature sensing circuit and a control circuit (not shown). The lines for the temperature sensing circuit and the control circuit are between the first layer 11, the second layer 12, the third layer 13, and the fourth layer 14. This part belongs to the prior art of multi-layer PCB technology, and is not repeated in details herein. The temperature sensing circuit is connected with the thermal conduction element 31 of the fourth layer 14. (That is, the thermistor of the temperature sensing circuit is in contact with the thermal conduction element 31 on the fourth layer 14 to detect the temperature thereof) The control circuit then has an electrical connection with the heating circuit 32 configured on the second layer 12 and the third layer 13.

The temperature sensing circuit detects the temperature of the thermal conduction element 31 and takes it as the operating temperature of electronic component 21. It is assumed here that the operating temperature of the electronic component 21 detected by the temperature sensing circuit is lower than a first preset value of the electronic component 21. The control circuit then enables the heating circuit 32 between the second layer 12 and the third layer 13 corresponding to the contact position of the electronic component 21. The thermal conduction element 31 on the fourth layer 14 corresponding to the contact position of the electronic component 21 provides thermal conduction to heat up the electronic component 21.

Now suppose that the operating temperature of electronic component 21 detected by the temperature sensing circuit is higher than a second preset value of the electronic component 21. The control circuit disables the heating circuit 32 between the second layer 12 and the third layer 13 corresponding to the contact position of the electronic component 21. The thermal conduction element 31 (see FIG. 3) provides thermal conduction to cool the electronic component 21.

Figure 5:
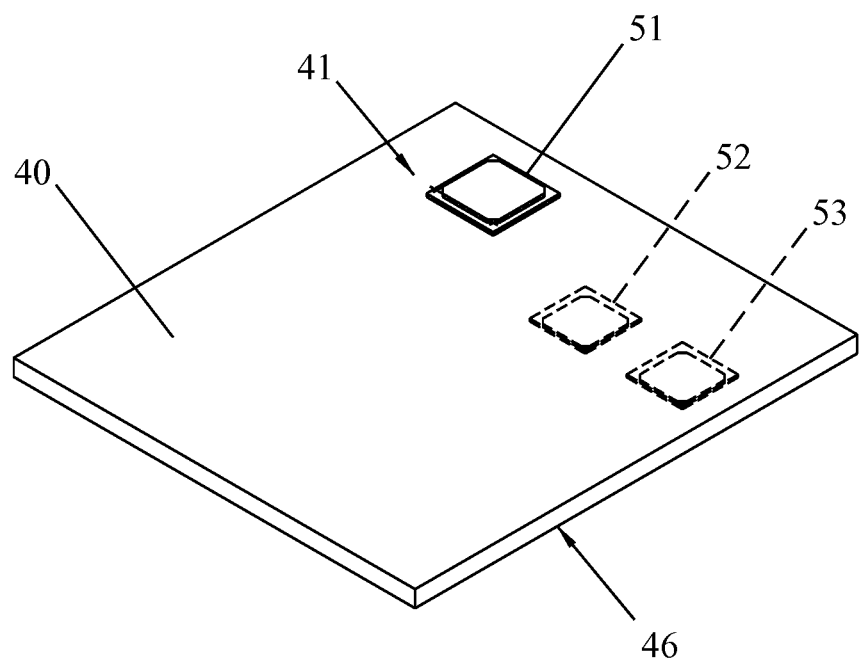
FIG. 5 is a three-dimensional view of the second embodiment.
Figure 6:
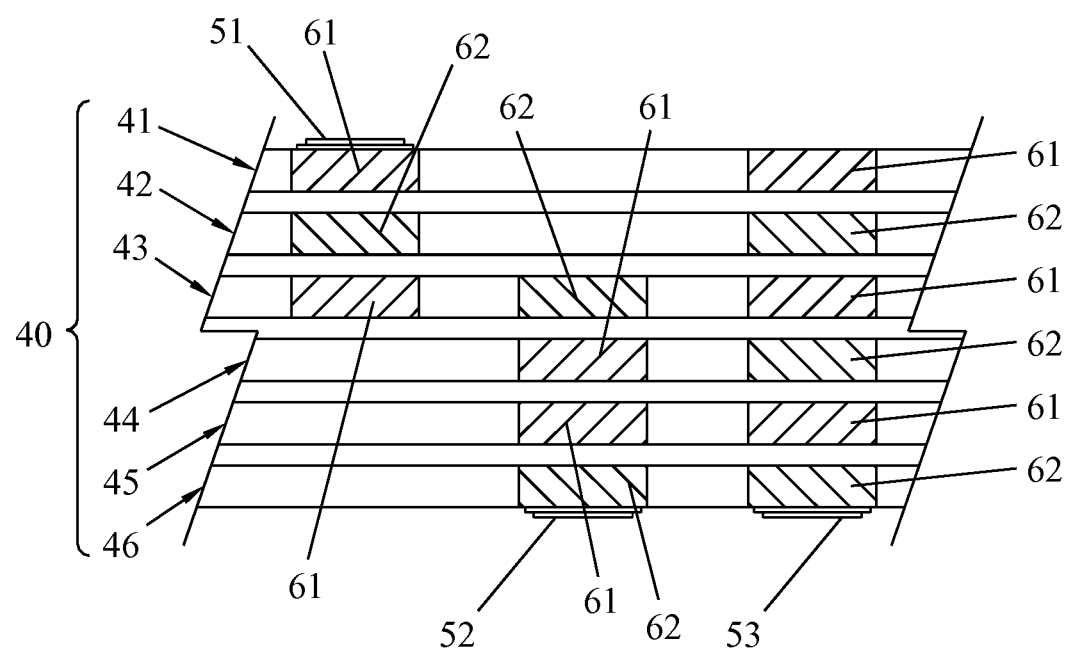
FIG. 6 is a side view of the multi-layer PCB in the second embodiment.

Please refer to FIGS. 5 and 6. FIG. 5 is a three-dimensional view of a second embodiment of the invention. FIG. 6 is a side view of the multi-layer PCB in the second embodiment.

In the second embodiment, the first electronic component 51, the second electronic component 52, and the third electronic component 53 are chips as an example. The multi-layer PCB 40 is a six-layered PCB. The multi-layer PCB 40 includes a first layer 41, a second layer 42, a third layer 43, a fourth layer 44, a fifth layer 45 and a sixth layer 46. The first layer 41 and the sixth layer 46 are the outer layers of the multi-layer PCB 40. The second layer 42, the third layer 43, the fourth layer 44, and the fifth layer 45 are the inner layers of the multi-layer PCB 40.

The first electronic component 51 is welded to have surface contact with the first layer 41 of the multi-layer PCB 40. The second electronic component 52 and the third electronic component 53 are welded to have surface contacts with the sixth layer 46 of the multi-layer PCB 40. In the second embodiment, the multi-layer PCB 40 can be a motherboard or an extension board (e.g., display card, sound card, extension card, etc).

Figure 7A:
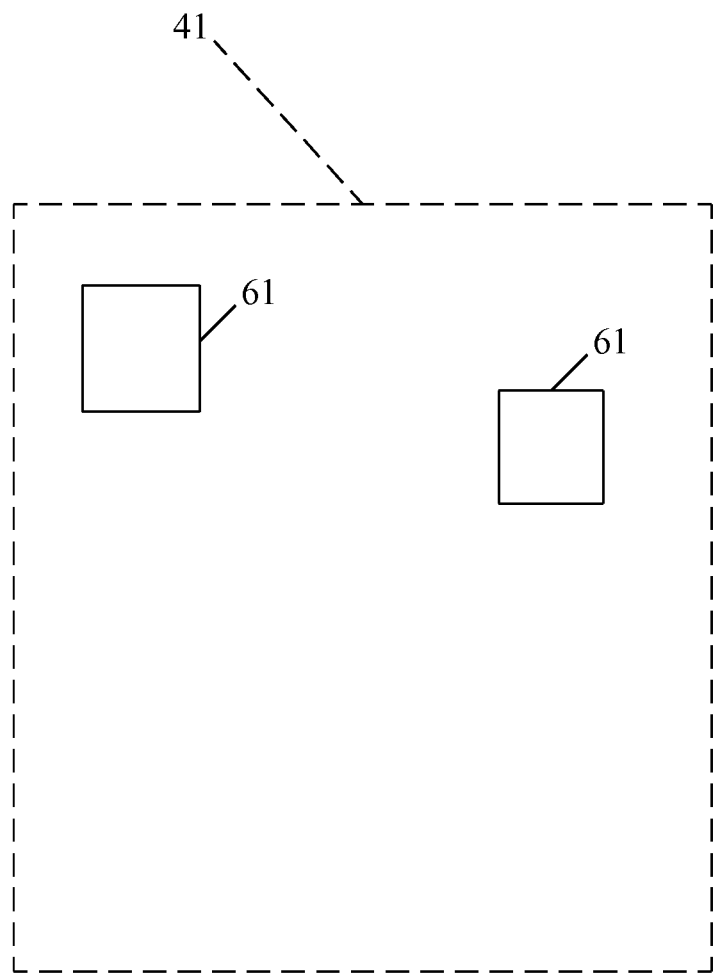
FIG. 7A is a planar view of the first layer of the multi-layer PCB in the second embodiment.

Please simultaneously refer to FIGS. 6 and 7A. FIG. 7A is a planar view of the configuration on the first layer of the multi-layer PCB.

The first electronic component 51 and the first layer 41 of the multi-layer PCB 40 are in surface contact. The third electronic component 53 and the sixth layer 46 of the multi-layer PCB 40 are in surface contact.

Therefore, a thermal conduction element 61 is provided on the first layer 41 adjacent to the first electronic element 51 at the position corresponding to the contact position of the first electronic element 51 and the first layer 41. Another thermal conduction element 61 is provided on the first layer 41 adjacent to the third electronic element 53 at the position corresponding to the contact position of the third electronic element 53 and the first layer 41.

Figure 7B:
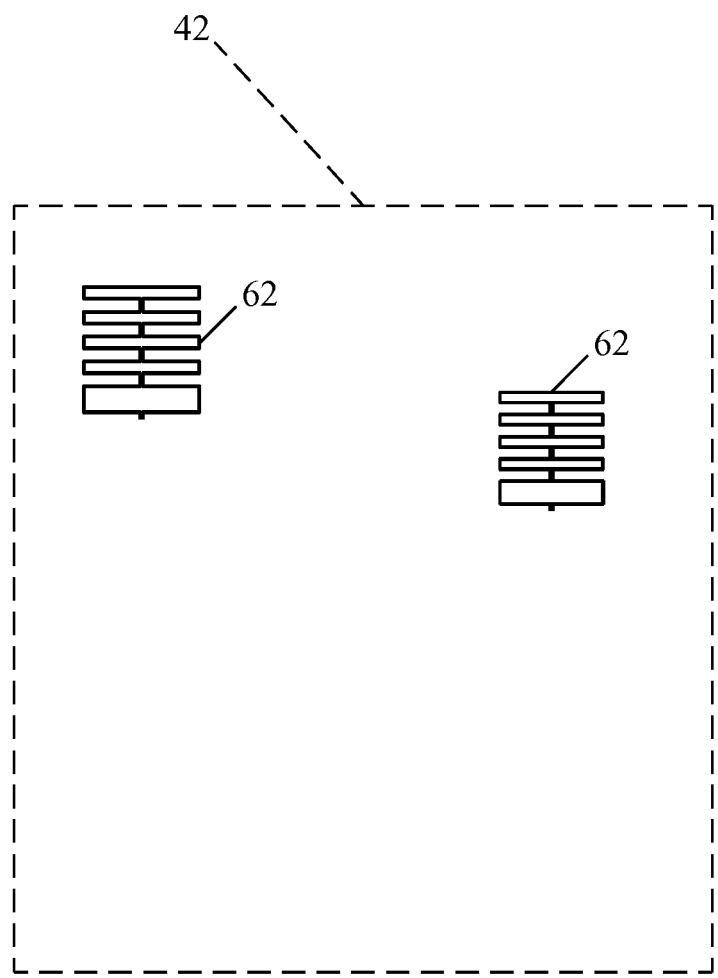
FIG. 7B is a planar view of the second layer of the multi-layer PCB in the second embodiment.

Please refer simultaneously to FIGS. 6 and 7B. FIG. 7B is a planar view of the configuration on the second layer of the multi-layer PCB in the second embodiment.

The first electronic component 51 and the first layer 41 of the multi-layer PCB 40 are in surface contact. The third electronic component 53 and the sixth layer 46 of the multi-layer PCB 40 are in surface contact.

Therefore, in the second embodiment, a heating circuit 62 is provided on the second layer 42 adjacent to the first electronic component 51, at the position corresponding to the contact position of the second layer 42 and the first electronic component 51. Another heating circuit 62 is provided on the second layer 42 adjacent to the third electronic component 53, at the position corresponding to the contact position of the second layer 42 and the third electronic component 53.

Figure 7C:
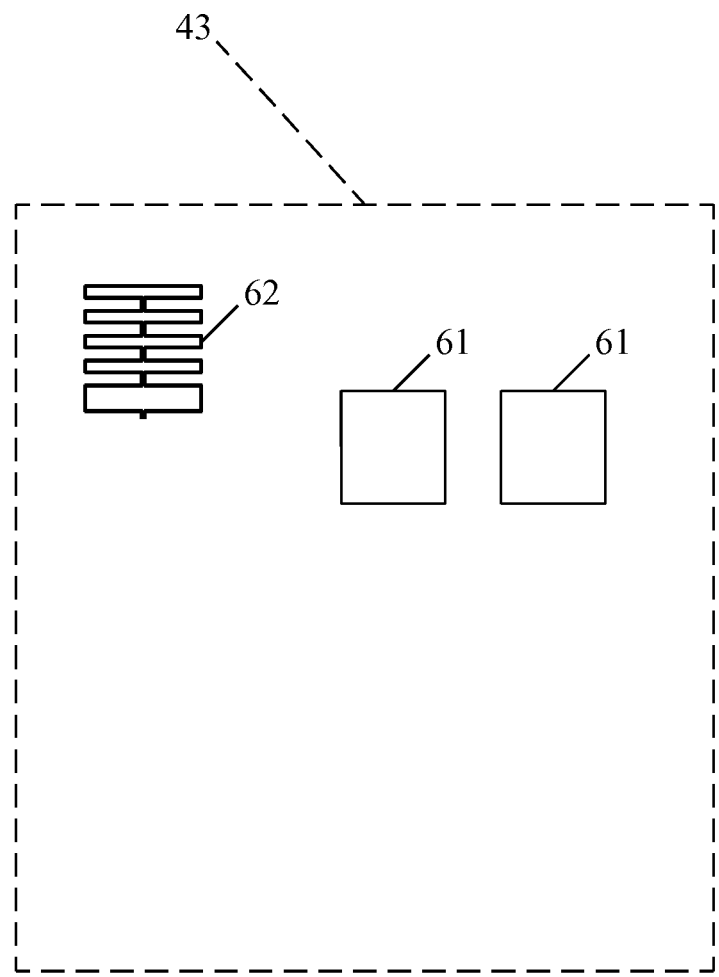
FIG. 7C is a planar view of the third layer of the multi-layer PCB in the second embodiment.

Please simultaneously refer to FIGS. 6 and 7C. FIG. 7C is a planar view of the configuration on the third layer of the multi-layer PCB in the second embodiment.

The first electronic component 51 and the first layer 41 of the multi-layer PCB 40 are in surface contact. The second electronic component 52 and the sixth layer 46 of the multi-layer PCB 40 are in surface contact. The third electronic component 53 and the sixth layer 46 of the multi-layer PCB 40 are in surface contact.

Therefore, in the second embodiment, a thermal conduction element 61 is provided on the third layer 43 adjacent to the first electronic component 51, at the position corresponding to the contact position of the third layer 43 and the first electronic component 51. A heating circuit 62 is provided on the third layer 43 adjacent to the third electronic component 53, at the position corresponding to the contact position of the third layer 43 and the third electronic component 53.

Figure 7D:
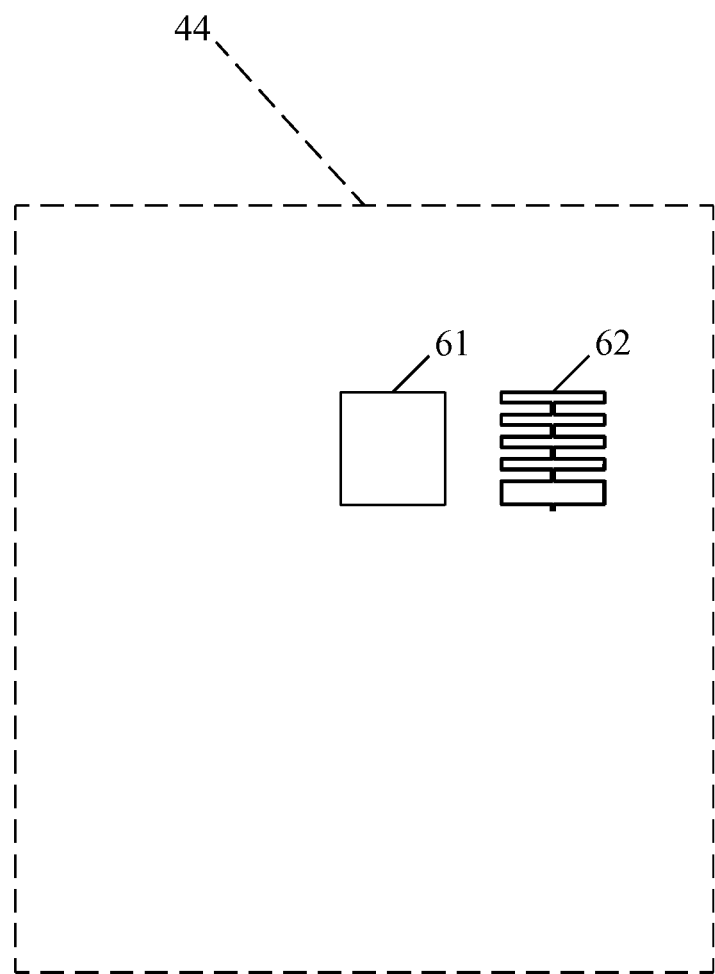
FIG. 7D is a planar view of the fourth layer of the multi-layer PCB in the second embodiment.

Please refer simultaneously to FIGS. 6 and 7D. FIG. 7D is a planar view of the configuration on the fourth layer of the multi-layer PCB in the second embodiment.

The second electronic component 52 and the sixth layer 46 of the multi-layer PCB 40 are in surface contact; and the third electronic component 53 and the sixth layer 46 of the multi-layer PCB 40 are in surface contact.

Therefore, in the second embodiment, a thermal conduction element 61 is provided on the fourth layer 44 adjacent to the second electronic component 52, at the position corresponding to the contact position of the fourth layer 44 and the second electronic component 52. Moreover, a heating circuit 62 is provided on the fourth layer 44 adjacent to the third electronic component 53, at the position corresponding to the contact position of the fourth layer 44 and the third electronic component 53.

Figure 7E:
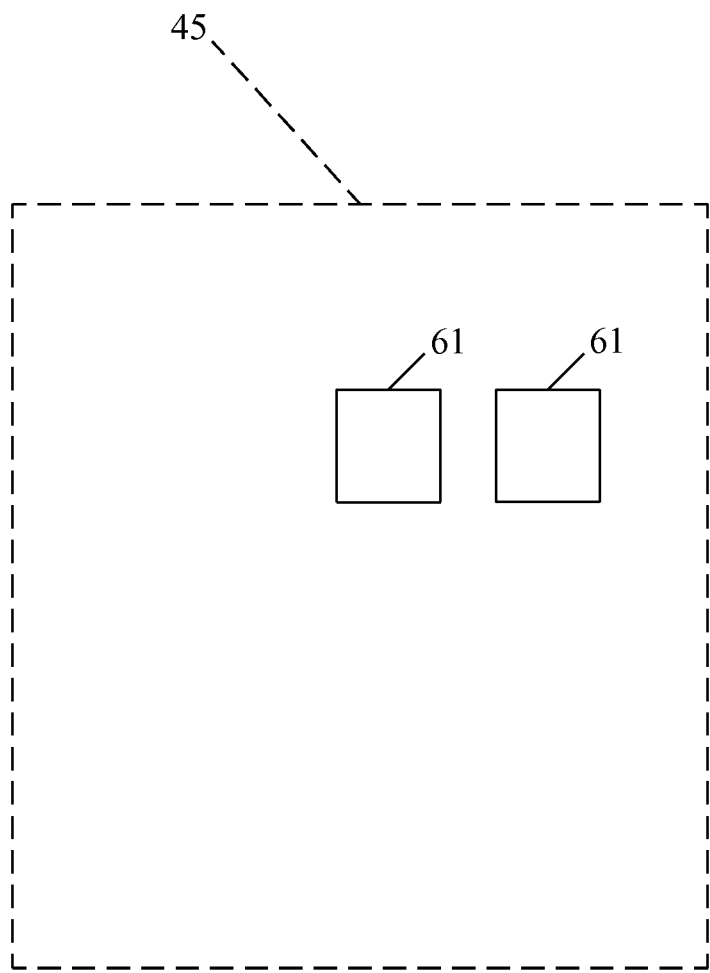
FIG. 7E is a planar view of the fifth layer of the multi-layer PCB in the second embodiment.

Please simultaneously refer to FIGS. 6 and 7E. FIG. 7E is a planar view of the configuration on the fifth layer of the multi-layer PCB.

The second electronic component 52 and the sixth layer 46 of the multi-layer PCB 40 are in surface contact; and the third electronic component 53 and the sixth layer 46 of the multi-layer PCB 40 are in surface contact.

Therefore, in the second embodiment, a thermal conduction element 61 is provided on the fifth layer 45 adjacent to the second electronic component 52, at the position corresponding to the contact position of the fifth layer 45 and the second electronic component 52. Moreover, another thermal conduction element 61 is provided on the fifth layer 45 adjacent to the third electronic component 53, at the position corresponding to the contact position of the fifth layer 45 and the third electronic component 53.

Figure 7F:
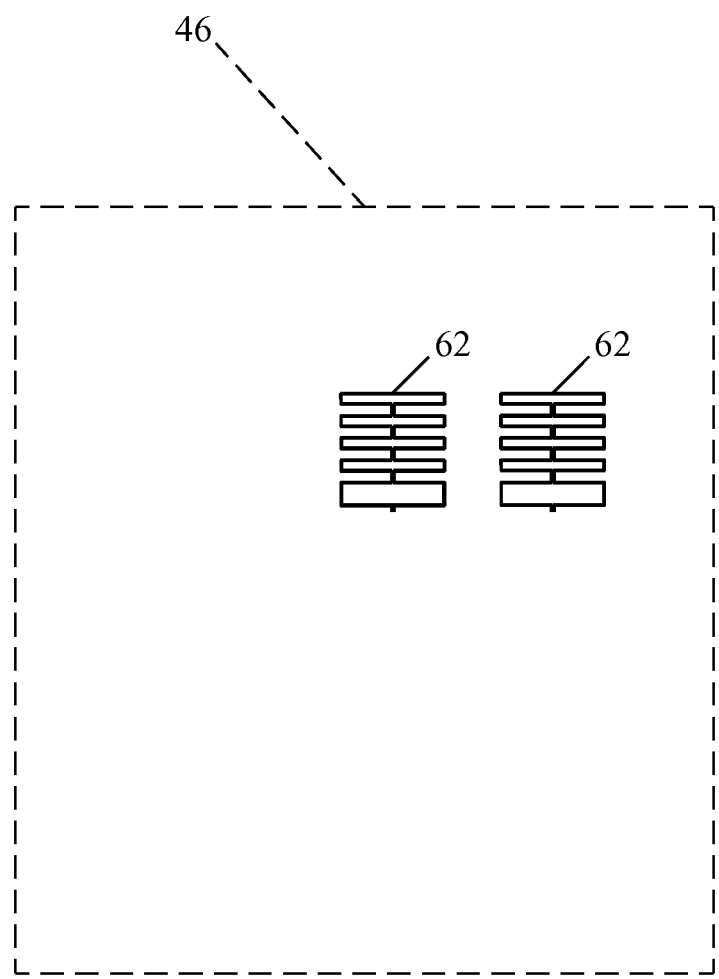
FIG. 7F is a planar view of the sixth layer of the multi-layer PCB in the second embodiment.

Please simultaneously refer to FIGS. 6 and 7F. FIG. 7F is a planar view of the configuration on the sixth layer of the multi-layer PCB.

The second electronic component 52 and the sixth layer 46 of the multi-layer PCB 40 are in surface contact; and the third electronic component 53 and the sixth layer 46 of the multi-layer PCB 40 are in surface contact.

Therefore, in the second embodiment, a heating circuit 62 is provided on the sixth layer 46 adjacent to the second electronic component 52, at the position corresponding to the contact position of the second electronic component 52 and the sixth layer 46. A heating circuit 62 is provided on the sixth layer 46 adjacent to the third electronic component 53, at the position corresponding to the contact position of the third electronic component 53 and the sixth layer 46.

The above-mentioned thermal conduction element 61 is made of the combination of metal, semiconductor, and polymer materials of high thermal conductivity. For example, the thermal conduction element 61 is a thick copper plate or aluminum plate. These are only examples in the first embodiment, and should not be used to restrict the scope of the invention.

The above thermal conduction element 61 has different sizes according to the sizes of the first electronic component 51, the second electronic component 52 and the third electronic component 53. The heating circuit 62 also has different size ranges and circuit densities according to the corresponding electronic component 51, second electronic component 52 and third electronic component 53.

Among the first layer 41, the second layer 42, third layer 43, the fourth layer 44, the fifth layer 45, and the sixth layer 46 of the multi-layer PCB 40, the one without being configured with a thermal conduction element 61 or heating circuit 62 can be the substrate of the PCB, such as FR-1, FR-2, FR-3, G-10, CEM-1, CEM-2 AIN, SIC, etc. It is further configured with a circuit. This is merely an example of the invention, and should not be used to restrict the scope of the invention.

Please refer to FIGS. 5 and 6 again. The surface(s) of the first layer 41 and/or the sixth layer 46 is configured with electronic components of the temperature sensing circuit and the control circuit (not shown). The lines for the temperature sensing circuit and the control circuit are provided between the first layer 41, the second layer 42, the third layer 43, the fourth layer 44, the fifth layer, and the sixth layer 46. Such arrangements belong to the prior art of multilayer PCB technology, and are not detailed herein.

The temperature sensing circuit is in connection with the thermal conduction element 61 configured corresponding to the contact position of the first electronic component 51 on the first layer 41 (that is, the thermistor of the temperature sensing circuit is in contact with the thermal conduction element 61 on the first layer 41 to measure the temperature thereof). The temperature sensing circuit electrically connects with the heating circuit 62 configured corresponding to the contact position of the second electronic component 52 on the sixth layer 46. The temperature sensing circuit also electrically connects to the heating line 62 configured corresponding to the contact position of the third electronic component 53 on the sixth layer 46. Moreover, the control circuit electrically connects to the heating circuits 62 configured on the second layer 42, the third layer 43, the fourth layer 44, and the sixth layer 46.

The temperature sensing circuit detects the temperature of the thermal conduction element 61 configured corresponding to the contact position of the first electronic component 51 on the first layer 41 and uses the temperature as the operating temperature of the first electronic element 51. The temperature sensing circuit detects the temperature of the heating circuit 62 configured corresponding to the contact position of the second electronic component 52 on the sixth layer 46 and uses the temperature as the operating temperature of the second electronic component 52. The temperature sensing circuit detects the temperature of the heating circuit 62 configured corresponding to the contact position of the third electronic component 53 on the sixth layer 46 and uses the temperature as the operating temperature of the electronic component 53.

Suppose that the operating temperature of the second electronic component 52 measured by the temperature sensing circuit is lower than the first default value for the second electronic component 52. The control circuit then enables the heating circuits 62 on the third layer 43 and the sixth layer 46 corresponding to the contact position of the second electronic component 52. The thermal conduction elements 61 on the fourth layer 44 and the fifth layer 45 corresponding to the contact position of the second electronic component 52 transfer heat to heat up the second electronic component 52.

Suppose that the operating temperature of the third electronic component 53 measured by the temperature sensing circuit is higher than the second default value for the third electronic component 53. The control circuit then disables the heating circuits 62 on the second layer 42, the fourth layer 44, and the sixth layer 46 corresponding to the contact position of the third electronic component 53. The thermal conduction elements 61 configured on the first layer 41, the third layer 43, and the fifth layer 45 corresponding to the contact position of the third electronic component 53 provide heat transfer to cool down the third electronic element 53.

Suppose that the operating temperature of the first electronic component 51 measured by the temperature sensing circuit is between the first default and the second default value of the first electronic component 51. The control circuit then controls the heating circuit 62 on the second layer 42 corresponding to the contact position of the first electronic component 51 to maintain its original state (that is, the heating circuit 62 remains enabled if it is already enabled or disabled if it is already disabled). With the heat conduction of the thermal conduction elements 61 on the first layer 41 and the third layer 43 corresponding to the contact position of the first electronic component 51, the first electronic component 51 is either heated or cooled.

The above-mentioned example should not be used to limit the scope of the invention. Moreover, the first default value is set to be different for different electronic components. That is, the electronic component 21, the first electronic component 51, the second electronic component 52, and the third electronic component 53 have different operating temperature values. The second default value is also set to be different for different electronic components. Thus, the electronic component 21, the first electronic component 51, the second electronic component 52, and the third electronic component 53 have different operating temperature values.

Therefore, the invention can maintain the electronic component 21, the first electronic component 51, the second electronic component 52, and the third electronic component 53 at their respective normal operating temperatures, preventing them from working at overheated temperatures and causing errors. This ensures the stability of the electronic component 21, the first electronic component 51, the second electronic component 52, and the third electronic component 53, and increases the lifetime thereof.

The second embodiment shows the relation between the thermal conduction elements 61 and the heating circuits 62 (see FIG. 6). This is only an example, and should not be used to limit the scope of the invention. The other configuration relation between the thermal conduction elements 61 and the heating circuits 62 should be included within the invention.

In the above example, the electronic component is a hard disk drive as an example. The electronic component can also be a panel. Again, these are only examples and should not be used to limit the scope of the invention.

In summary, the invention differs from the prior art in that the electronic component is in touch with the outer surface of the multi-layer PCB. At least the two layers adjacent to the electronic component are configured with heating circuits and thermal conduction elements corresponding to the contact position of the electronic element. The temperature sensing circuit in the multi-layer PCB detects the operating temperature of the electronic component. When the operating temperature of the electronic component measured by the temperature sensing circuit is lower than the first default value, the control circuit in the multi-layer PCB enables the heating circuit corresponding to the electronic component. Through the heat transfer of the thermal conduction element, the corresponding electronic component is heated up. When the operating temperature of the electronic component measured by the temperature sensing circuit is higher than the second default value, the control circuit in the multi-layer PCB disables the heating circuit corresponding to the electronic component. Through the heat transfer of the thermal conduction element, the corresponding electronic component is cooled down. This mechanism prevents the electronic component from going beyond its own operating temperature range, thereby increasing the stability and lifetime of the electronic component.

The disclosed technique solves the problem existing in the prior art that the temperatures of electronic components working in high-temperature environments and low-temperature environments may exceed their critical operating temperatures. The invention thus maintains the electronic components within their operating temperature ranges in different temperature environments.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A heating and heat dissipating multi-layer circuit board structure for keeping operating temperatures of electronic component(s), comprising:
   at least one electronic component; and
   a multi-layer printed circuit board (PCB), wherein the electronic component(s) is/are in contact with outer surfaces of the multi-layer PCB, at least the two layers adjacent to each of the electronic component(s) is/are configured with at least one heating circuit and at least one thermal conduction element at the position corresponding to the contact position of the electronic component(s), and the multi-layer PCB further includes:
      a temperature sensing circuit in electrical connection with at least one of the heating circuits or in connection with at least one of the thermal conduction elements configured on the multi-layer PCB to detect a temperature thereof and using the temperature as the operating temperature thereof; and
      a control circuit in electrical connection with at least one of the heating circuits, wherein
      when the operating temperature of one of the electronic component(s) measured by the temperature sensing circuit is lower than a first default value corresponding to the electronic component, the heating circuit corresponding to the contact position of the electronic component is enabled, with the corresponding thermal conduction element transferring heat, to heat up the electronic component, with the first default value being set to have different values for different electronic component(s); and when the operating temperature of one of the electronic component(s) measured by the temperature sensing circuit is lower than a second default value corresponding to the electronic component, the heating circuit corresponding to the contact position of the electronic component is disabled, with the corresponding thermal conduction element transferring heat, to cool down the electronic component, with the second default value being set to have different values for different electronic component(s).

2. The heating and heat dissipating multi-layer circuit board structure for keeping operating temperatures of electronic component(s) of claim 1, wherein the electronic component(s) is/are selected from the combination of chip(s), hard disk drive(s), and panel(s).

3. The heating and heat dissipating multi-layer circuit board structure for keeping operating temperatures of electronic component(s) of claim 1, wherein the thermal conduction elements are made of the combination of metal, semiconductor, and polymer materials of high thermal conductivities.

4. The heating and heat dissipating multi-layer circuit board structure for keeping operating temperatures of electronic component(s) of claim 1, wherein the electronic component(s) is/are glued to have contact with the outer surfaces of the multi-layer PCB.

5. The heating and heat dissipating multi-layer circuit board structure for keeping operating temperatures of electronic component(s) of claim 1, wherein the electronic component(s) is/are welded to have contact with the outer surfaces of the multi-layer PCB.

6. The heating and heat dissipating multi-layer circuit board structure for keeping operating temperatures of electronic component(s) of claim 1, wherein the heating circuit have different ranges of coverage and circuit densities for the different electronic component(s).

7. The heating and heat dissipating multi-layer circuit board structure for keeping operating temperatures of electronic component(s) of claim 1, wherein the thermal conduction elements have different ranges of coverage for the different electronic component(s).

\* \* \* \* \*